US011456767B2

(12) United States Patent
Hsu et al.

(10) Patent No.: US 11,456,767 B2
(45) Date of Patent: Sep. 27, 2022

(54) METHOD FOR RECEIVING DATA AND DATA RECEIVER

(71) Applicant: REALTEK SEMICONDUCTOR CORPORATION, Hsinchu (TW)

(72) Inventors: Chi-Sheng Hsu, Hsinchu (TW); Yan-Guei Chen, Hsinchu (TW); Shih-Hsiung Huang, Hsinchu (TW); Liang-Wei Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/209,575

(22) Filed: Mar. 23, 2021

(65) Prior Publication Data

US 2022/0209806 A1    Jun. 30, 2022

(30) Foreign Application Priority Data

Dec. 29, 2020    (TW) .................................. 109146722

(51) Int. Cl.
*H04B 1/12*    (2006.01)
*H04B 1/10*    (2006.01)
(Continued)

(52) U.S. Cl.
CPC .............. *H04B 1/12* (2013.01); *H03G 3/3036* (2013.01); *H04B 1/1027* (2013.01); *H04B 1/16* (2013.01); *H03G 2201/307* (2013.01)

(58) Field of Classification Search
CPC .......... H04B 1/12; H04B 1/1027; H04B 1/16; H03G 3/3036; H03G 2201/307
See application file for complete search history.

(56) References Cited

U.S. PATENT DOCUMENTS 7,970,066 B1 *   6/2011   Lee .................... H04L 27/08
                                                375/260
8,213,891 B2 *   7/2012   Kim .................. H04L 27/2647
                                                375/345
(Continued)

FOREIGN PATENT DOCUMENTS

EP          1835624 A2 *   9/2007   .......... H03F 3/45188
EP          1371200 B1 *  10/2011   ........... H03M 1/0624
WO   WO-2009152394 A1 *  12/2009   ............... H03G 3/30

*Primary Examiner* — Jean B Corrielus
(74) *Attorney, Agent, or Firm* — WPAT, P.C., Intellectual Property Attorneys; Anthony King

(57) ABSTRACT

A method for receiving data includes receiving a transmission signal through a channel, adjusting the intensity of the transmission signal to generate an adjusted transmission signal according to an analog gain level, converting the adjusted transmission signal into a digital signal, filtering the digital signal to generate a filtered signal according to a set of filter coefficients, and adjusting intensity of the filtered signal according to a digital gain level. The method further includes, in a training mode, estimating a transmission condition of the channel and adjusting the analog gain level and the digital gain level according to the transmission condition for obtaining convergent values for the set of filter coefficients before the training mode ends, and in a data mode, performing a gain adjustment operation to adjust the analog gain level and to adjust the digital gain level according to the adjustment made to the analog gain level.

20 Claims, 4 Drawing Sheets

(51) Int. Cl.
*H03G 3/30* (2006.01)
*H04B 1/16* (2006.01)

(56) References Cited

U.S. PATENT DOCUMENTS

| | | | |
|---|---|---|---|
| 8,477,887 B2 * | 7/2013 | Challa | H03G 3/3078 375/345 |
| 8,625,704 B1 | 1/2014 | Sedarat et al. | |
| 8,854,945 B2 * | 10/2014 | Gaal | H04W 52/16 370/252 |
| 2003/0086509 A1 * | 5/2003 | Zogakis | H03G 1/0088 375/345 |
| 2006/0084402 A1 * | 4/2006 | Oshima | H04B 1/1027 375/345 |
| 2018/0287647 A1 * | 10/2018 | Morishita | H04B 1/16 |

\* cited by examiner

METHOD FOR RECEIVING DATA AND DATA RECEIVER

TECHNICAL FIELD

The present application relates to a method for receiving data, in particular, to a method for receiving data capable of adjusting gain in a data mode.

BACKGROUND

When transmitting data over a network, a physical layer receiver (PHY) is often used to optimize the transmission channel in order to maintain the quality of the received signal. For example, the PHY uses a programmable gain amplifier (PGA) to amplify the transmitted signal to compensate for the fading caused by the transmission of the signal in the channel.

According to the Institute of Electrical and Electronics Engineers (IEEE) regulations for Ethernet data transmission, PHY can have a training mode and a data mode. In the training mode, the PHY evaluates the transmission channel and optimizes the gain of the PGA. In the data mode, the PHY amplifies the transmitted signal based on the optimized gain. However, in real-world applications, the channel condition varies over time; for example, the radio frequency interference (RFI) in the environment may suddenly appear or disappear, causing the initially optimized gain no longer meet the requirements and degrading the signal quality. Therefore, a dynamic adjustment of the gain in the data mode for maintaining the received signal's quality has become an issue to be solved in this field.

SUMMARY OF THE INVENTION

One embodiment of the present disclosure discloses a method for receiving data. The method includes receiving a first transmission signal from a first channel, adjusting the intensity of the first transmission signal to generate an adjusted transmission signal according to an analog gain level, converting the adjusted transmission signal into a digital signal, filtering the digital signal to generate a filtered signal according to a set of filter coefficients, and adjusting the intensity of the filtered signal according to a digital gain level.

The method for receiving data further includes, in a training mode, estimating a transmission condition of the first channel, and adjusting the analog gain level and the digital gain level according to the estimation result of transmission condition of the first channel, so as to obtain convergent values for the set of filter coefficients before the training mode ends, and in a data mode, performing a first gain adjustment operation to adjust the analog gain level and to correspondingly adjust the digital gain level according to the adjustment made to the analog gain level in the data mode.

Another embodiment of the present disclosure discloses a data receiver. The data receiver includes a first receiving path and a controller.

The first receiving path receives a first transmission signal from a first channel, and the first receiving path includes a programmable gain amplifier, an analog to digital converter, an equalizer, a digital automatic gain control circuit. The programmable gain amplifier adjusts the intensity of the first transmission signal to generate an adjusted transmission signal according to an analog gain level. The analog to digital converter converts the adjusted transmission signal into a digital signal. The equalizer filters the digital signal to generate a filtered signal according to a set of filter coefficients. The digital automatic gain control circuit adjusts the intensity of the filtered signal according to a digital gain level.

The controller is coupled to the first receiving path. In a training mode, the controller estimates a transmission condition of the first channel, and adjusts the analog gain level and the digital gain level according to the estimation result of the transmission condition of the first channel, so as to obtain convergent values for the set of filter coefficients before the training mode ends. In a data mode, the controller performs a first gain adjustment operation to adjust the analog gain level and to correspondingly adjust the digital gain level according to the adjustment made to the analog gain level in the data mode.

DETAILED DESCRIPTION

Figure 1:
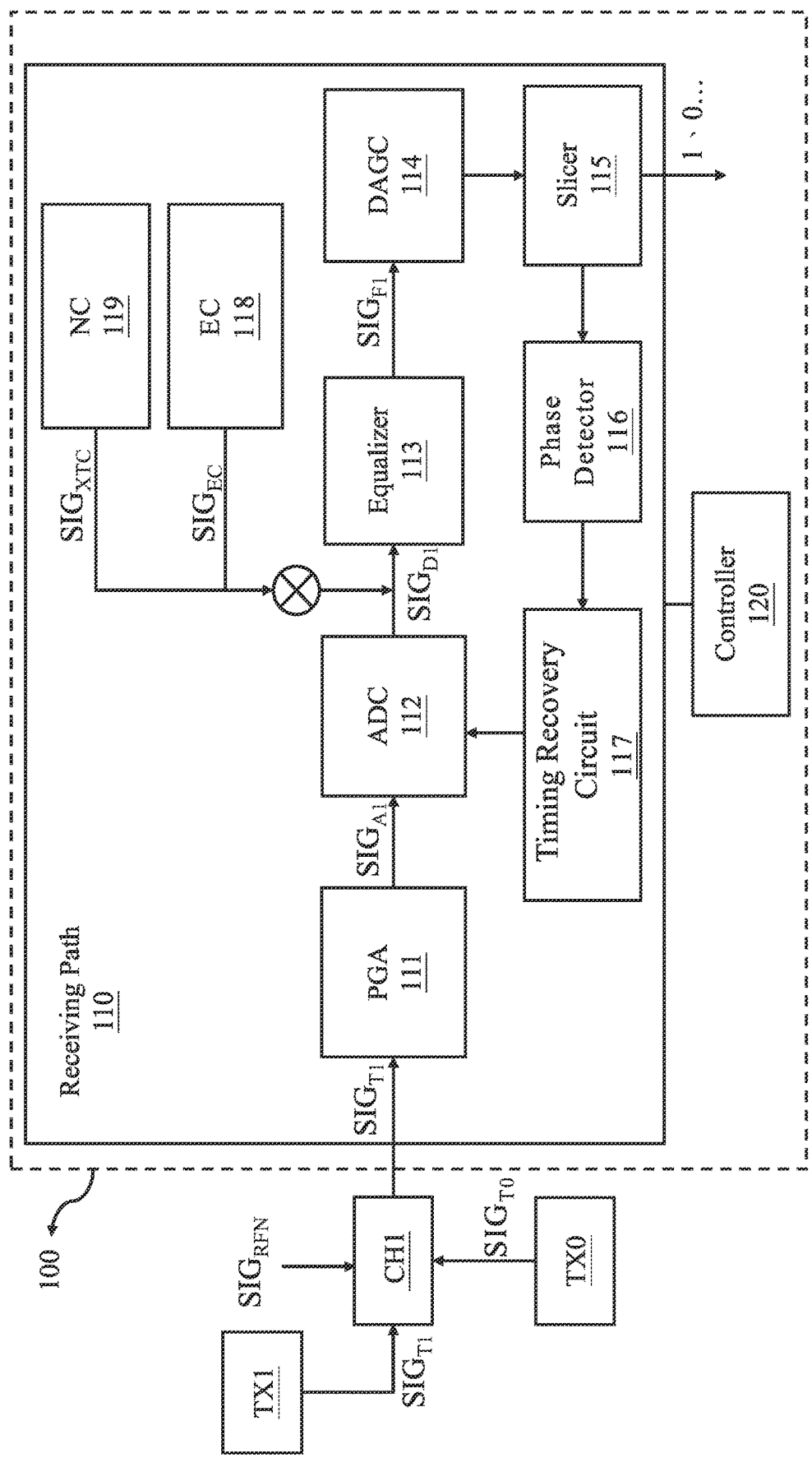
FIG. 1 is a schematic diagram illustrating a data receiver according to one embodiment of the present disclosure.

FIG. 1 is a schematic diagram illustrating a data receiver 100 according to one embodiment of the present disclosure. In some embodiments, the data receiver 100 can be, for example, a physical layer receiver (PHY) for use in Ethernet. The data receiver 100 can include a receiving path 110 and a controller 120.

The receiving path 110 can be coupled to an external channel CH1 and can receive the transmission signal $SIG_{T1}$ from the channel CH1. The receiving path 110 can include a programmable gain amplifier (PGA)111, an analog to digital converter (ADC)112, an equalizer 113, and a digital automatic gain control circuit (DAGC)114.

In some embodiments, the analog gain level of the PGA 111 can be switched among different values to provide different levels of gain to the input signal. In other words, the PGA 111 can adjust the intensity of a transmission signal $SIG_{T1}$ to generate an adjusted transmission signal $SIG_{A1}$ according to its analog gain level. Then, the ADC 112 can convert the adjusted transmission signal $SIG_{A1}$ into a digital signal $SIG_{D1}$, whereas the equalizer 113 can filter the digital signal $SIG_{D1}$ according to an internal set of filter coefficients to generate a filtered signal $SIG_{F1}$. By filtering the digital signal $SIG_{D1}$, it is feasible to adjust the waveform of the digital signal $SIG_{D1}$, thereby improving the accuracy for determining values of the subsequent signals.

Moreover, the digital gain level of the DAGC 114 can be switched among different values so as to provide different levels of gain to the input signal. In other words, the DAGC 114 can adjust the intensity of the filtered signal $SIG_{F1}$ according to its digital gain level. In some embodiments, the receiving path 110 can further include a slicer 115, wherein the slicer 115 can segment the filtered signal $SIG_{F1}$ so as to distinguish the data values in the filtered signal $SIG_{F1}$.

The controller 120 is coupled to the receiving path 110. The controller 120 is configured to, in the training mode, estimate the transmission condition of the channel CH1, for example, estimate the length of the channel CH1 and the level of the signal decay, but the present embodiment is not limited thereto. Besides, in some embodiments, estimating the transmission condition is also referred to as channel estimation, Next, the controller 120 can adjust the analog gain level of the PGA 111 and the digital gain level of the DAGC 114 according to the estimation result of the transmission condition of the channel CH1 so as to obtain convergent values for the set of filter coefficients of the equalizer 113 before the training mode ends, so that the receiving path 110 can process the transmission signal $SIG_{T1}$ in an optimized condition.

Due to the variance generated during the manufacturing process, for the PGAs 111 in different receiving paths with the same analog gain level, the gain provided by these PGAs 111 may differ; therefore, in some embodiments, to ensure that the controller 120 can accurately adjust the analog gain level of the PGA 111, the controller 120 can, in the training mode, switch the analog gain level of the PGA 111 among a plurality of values, so as to adjust the intensity of the transmission signal $SIG_{T1}$ to different extents and generate the corresponding adjusted transmission signal $SIG_{A1}$. Also, the controller 120 can record an average value of signal intensities of the digital signals $SIG_{D1}$ that are generated after the ADC 112 converts the analog gain level with different values. For example, if the analog gain level of the PGA 111 can be switched among value 1 to value 32 to provide 32 levels of different gains, the controller 120 can first set the analog gain level of the PGA 111 as 1, and record the average signal intensity of the digital signal $SIG_{D1}$ outputted by the ADC 112 when the analog gain level is 1 during a predetermined period. Next, the controller 120 can set the analog gain level of the PGA 111 as 2, and record the average signal intensity of the digital signal $SIG_{D1}$ outputted by the ADC 112 when the analog gain level is 2 during a predetermined period, and so on. In this way, the average signal intensities of the digital signal $SIG_{D1}$ in different analog gain levels are recorded. In this way, in the training mode, the controller 120 can adjust the analog gain level according to the estimation result of the transmission condition of the channel CH1 and the average value of the signal intensity corresponding to the analog gain level of each value, so that it is feasible to adjust the analog gain level to a value that fits the actual need. It is noted that the foregoing embodiments are provided for the purpose of illustration, rather than a limitation. In some embodiments, it is not limited to switching the analog gain level of the PGA 111 from the lowest value in an incremental way.

In some embodiments, after the equalizer 113, in the training mode, obtains convergent values of said set of filter coefficients, the data receiver 100 enters a data mode. In the data mode, the receiving path 110 can receive the transmission signal $SIG_{T1}$ from the channel CH1 and process the transmission signal $SIG_{T1}$ according to the adjustments or settings that the controller 120 made to the PGA 111, the DAGC 114, the equalizer 113 and other circuits in the training mode. However, in the data mode, if there is a change to the transmission condition of the channel CH1, then the optimization setting that the controller 120 made to the receiving path 110 in the training mode may not fit the need, thereby resulted in the reduction of the receiving signal's quality.

For example, in some embodiments, the data receiver 100 can further include a phase detector 116 and a timing recovery circuit 117. In the training mode, the phase detector 116 can detect the phase of the transmission signal $SIG_{T1}$ according to the operation of the slicer 115 and transmit the phase data to the timing recovery circuit 117, whereas the timing recovery circuit 117 can adjust the sampling phase of the ADC 112 according to the phase data. However, in the data mode, if the signal transmitting terminal TX1 (i.e., the far end transmitter) of the transmission signal $SIG_{T1}$ changes the sampling phase, the phase detector 116, the timing recovery circuit 117, and the ADC 112 will be adjusted accordingly to follow the sampling phase of the signal transmitting terminal TX1 of the transmission signal $SIG_{T1}$. During the adjustment of the sampling phase, the local signal transmitting terminal (i.e., the near-end transmitter) TX0 that is disposed at the same transmission terminal of the data receiver 100 will also change, so that the phase of the echo noise $SIG_{T0}$ is changed, thereby increasing the near-end noise and jeopardizing the quality of the receiving signal. Moreover, in some embodiments, if external radio frequency interference signal $SIG_{RFN}$ initially received by the data receiver 100 in the training mode disappears suddenly or if an external radio frequency interference signal $SIG_{RFN}$ that is not present in the training mode appears in the data mode, the transmission condition of the channel CH1 will be affected, thereby resulting in a reduction of the receiving signal's quality.

In the data mode, to prevent the receiving signal's quality from being affected because of the change of the transmission condition of the channel CH1, the controller 120 can, in the data mode, perform a gain adjustment operation to adjust the analog gain level of the PGA 111 and correspondingly adjust the digital gain level of the DAGC 114 according to the adjustment made to the analog gain level in the data mode. In this way, it is feasible to adjust the analog gain level of the PGA 111 dynamically to maintain the signal quality and compensate for the changes of the analog gain level by adjusting the digital gain level of the DAGC 114, thereby reducing the gain error.

During the gain adjustment operation, the controller 120 can compare the relationship between the maximum intensity of the digital signal $SIG_{D1}$ and a preset upper limit UL and a preset lower limit LL, and adjust the value of the analog gain level accordingly. In some embodiments, the preset upper limit UL can be the sum of the maximum expected value AO and the tolerance value AR of the digital signal $SIG_{D1}$, whereas the preset lower limit LL can be the difference between the maximum expected value AO and the tolerance value AR of the digital signal $SIG_{D1}$, see, Equation (1) and Equation (2).

$$UL=AO+AR \qquad \text{(Equation 1)}$$

$$LL=AO-AR \qquad \text{(Equation 2)}$$

In this case, when the controller 120 determines that the maximum intensity of the digital signal $SIG_{D1}$ is greater than the preset upper limit UL, the controller 120 can reduce the analog gain level to reduce the gain provided by the PGA 111. In contrast, when the controller 120 determined that the maximum intensity of the digital signal $SIG_{D1}$ is less than the preset lower limit LL, the controller 120 can increase the analog gain level so as to increase the gain provided by the PGA 111. Moreover, to prevent the controller 120 from repeatedly switching between two adjacent values when adjusting the analog gain level, when setting the tolerance value AR, it is feasible to set the tolerance value AR to be greater than the difference between the signal intensity average values of the digital signal $SIG_{D1}$ when the analog gain level is switched between any two adjacent values. For example, if, when the analog gain level is 32, the signal intensity average value of the digital signal $SIG_{D1}$ is 0.85, whereas, when the analog gain level is 31, the signal intensity average value of the digital signal $SIG_{D1}$ is 0.8, then the difference between said two signal intensity average values is 0.05; thus, the tolerance value can be greater than 0.05 so that the analog gain level becomes stable.

After completing the analog gain level adjustment, the controller 120 can adjust the digital gain level according to the adjustment to the analog gain level. For example, when the controller 120 reduces the analog gain level of the PGA 111, the controller 120 can increase the digital gain level according to the signal intensity difference of the digital signals $SIG_{D1}$ before and after the analog gain level reduction to prevent the gain error caused by the variation of the analog gain level. For example, if there is a 5% reduction between the signal intensity values of the digital signals $SIG_{D1}$ before and after the analog gain level reduction, then the controller 120 can increase the intensity of the filtered signal $SIG_F$ by 5% by adjusting the digital gain level of the DAGC 114, to compensate the gain error caused by the analog gain level adjustment.

Besides, in the embodiment shown in FIG. 1, the receiving path 110 can further include an echo canceller (EC) 118 and a near-end crosstalk canceller (NC) 119. For the ease of discussion, the coupling relationship among elements (e.g., elements in the above-mentioned signal transmitting terminal TX0) other than said two cancellers and the receiving path 110 is omitted; however, persons skilled in the art are able to recognize the signals used during the operation of said two cancellers. The echo canceller 118 can generate an echo compensation signal $SIG_{EC}$ to reduce the echo noise in the digital signal $SIG_{D1}$, whereas the near-end crosstalk canceller 119 can generate a crosstalk compensation signal $SIG_{XTC}$ to reduce the near-end crosstalk noise in the digital signal $SIG_{D1}$. In such cases, the controller 120 can further, when reducing the analog gain level, reduce the power of the echo compensation signal $SIG_{EC}$ and the power of the near-end crosstalk compensation signal $SIG_{XTC}$, according to the signal intensity difference of the digital signals $SIG_{D1}$ before and after the analog gain level reduction, to avoid over-compensation to the echo noise and near-end crosstalk noise.

Similarly, when the controller 120 increases the analog gain level, the controller 120 can reduce the digital gain level according to the signal intensity difference of the digital signals $SIG_{D1}$ before and after the analog gain level increases, so as to reduce the gain error. Also, the controller 120 can increase the power of the echo compensation signal $SIG_{EC}$ and the power of the near-end crosstalk compensation signal $SIG_{XTC}$ according to the signal intensity differences of the digital signal $SIG_{D1}$ before and after the analog gain level increases, so as to increase the compensational effect on the echo noise and near-end crosstalk noise correspondingly.

Moreover, in some embodiments, in order to avoid a fast or sudden change of the gain provided by the PGA 111, thus resulting in unstable quality of the receiving signal, the controller 120 may adjust the analog gain level to adjacent values each time it performs a gain adjustment operation; that is, it can increase or decrease the analog gain level by only one level each time it performs a gain adjustment operation. In this case, the controller 120 can continuously perform multiple gain adjustment operations to adjust the analog gain level to the appropriate value gradually. Besides, the controller 120 can wait for a period of time after every two adjacent gain adjustment operations so that the data receiver 100 is stabilized before performing the next gain adjustment operation in order to maintain the stability of the system. Besides, in order to avoid delaying other operations by continuously performing gain adjustment operations on the receiving path 110, in some embodiments, the data receiver 100 may also limit the number of consecutive gain adjustment operations that can be performed each time.

During the process of performing gain adjustment operation, the change of analog gain level and digital gain level will inevitably cause some signal distortion. To prevent the gain adjustment operation from affecting the reception and reading of important data, in some embodiments, the controller 120 may also first determine whether the channel CH1 is in a non-busy state, and perform the gain adjustment operation on the receive path 110 only when the channel CH1 is in the non-busy state. For example, the controller 120 can receive control signals from the upper circuit and determine whether the channel CH1 is currently in the non-busy state accordingly; for example, when the system is in an idle state or power saving Ethernet (EEE) refresh state, the controller 120 can determine that the channel CH1 is currently in the non-busy state and perform the gain adjustment operation; otherwise, the controller 120 will not perform the gain adjustment operation. However, the present disclosure is not limited to this; in some embodiments, the controller 120 can also perform gain adjustment operation when the system is in a busy state; in such cases, the controller 120 does not detect whether the system is in the non-busy state.

Figure 2:
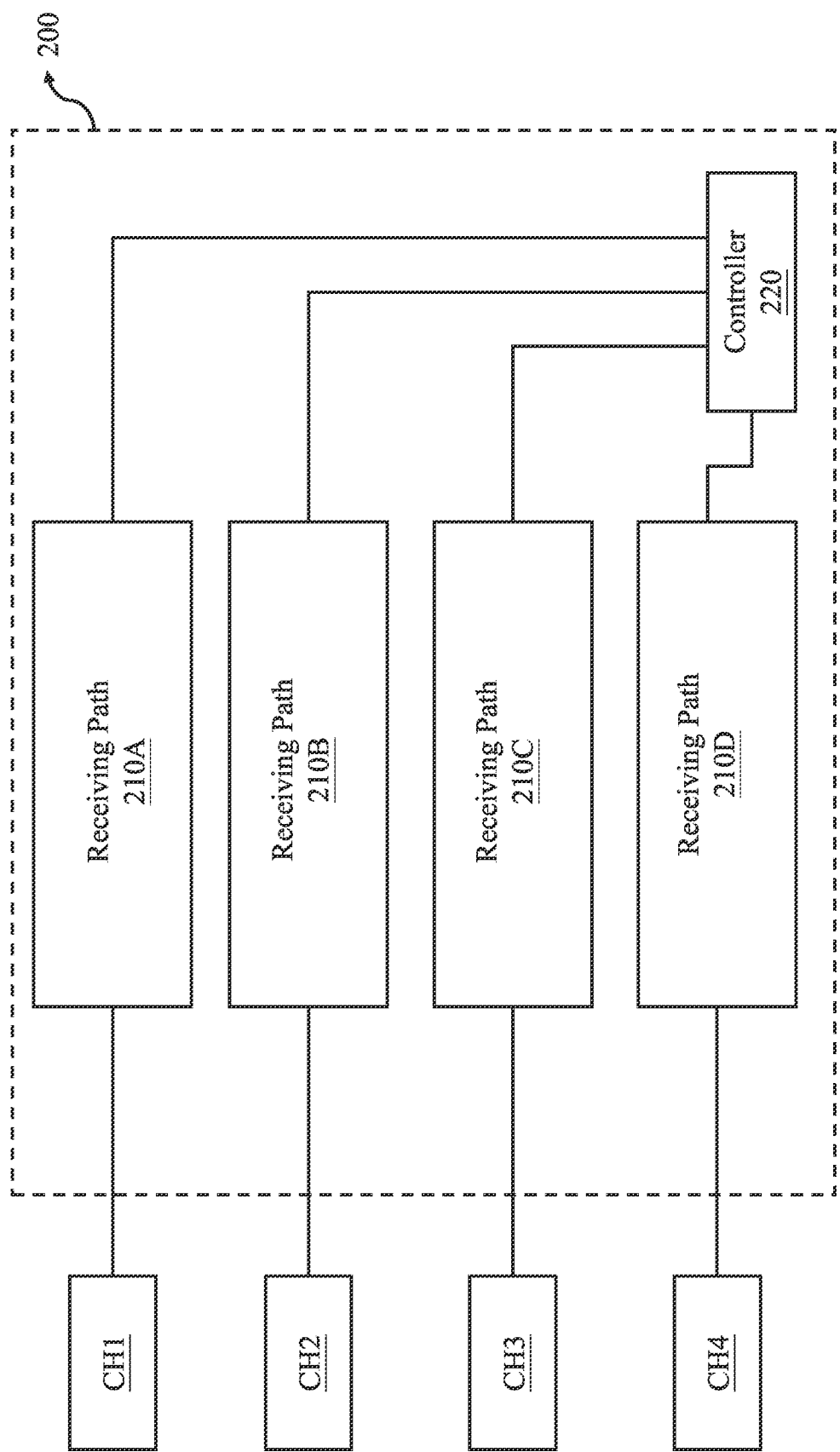
FIG. 2 is a schematic diagram illustrating a data receiver according to another embodiment of the present disclosure.

FIG. 2 is a schematic diagram illustrating a data receiver 200 according to another present disclosure's embodiment. The data receiver 200 and the data receiver 100 include similar structures and can operate according to similar principles; however, the data receiver 200 can include the controller 220 and receiving paths 210A, 210B, 210C, and 210D. In some embodiments, the receiving paths 210A, 210B, 210C, and 210D can have structures similar to the receiving path 110 of FIG. 1 and can be coupled to channels CH1, CH2, CH3, and CH4, respectively. In this case, the data receiver 200 can, in the training mode, estimate the transmission condition of the channels CH1, CH2, CH3, and CH4, and adjust or set the circuits in the receiving paths 210A, 210B, 210C, and 210D accordingly, so that the receiving paths 210A, 210B, 210C, and 210D can obtain convergent values for the set of filter coefficients; and the data receiver 200 can, in the data mode, receive transmission signals via receiving paths 210A, 210B, 210C, and 210D from channels CH1, CH2, CH3, and CH4, respectively.

In some embodiments, the controller 220 can, in the data mode, perform the gain adjustment operation on the receiving paths 210A, 210B, 210C, and 210D, respectively, so as to adjust the analog gain level of the programmable gain amplifiers in the receiving path 210A, 210B, 210C, and 210D, respectively, and to adjust the digital gain level of the digital automatic gain control circuits in the receiving path 210A, 210B, 210C, and 210D accordingly, so as to achieve a dynamic adjustment to the signal gain to maintain signal quality.

In some embodiments, the controller 220 can have all or a portion of the paths 210A, 210B, 210C, and 210D perform the gain adjustment operation in a pre-determined order; e.g., performing the gain adjustment operation on the receiving paths in the order of 210A, 210B, 210C, and 210D or in the order of 210B, 210A, 210D and 210C. However, the present disclosure is not limited to this; in some embodiments, the controller 220 can determine the sequence in which the gain adjustment operation is performed according to the signal to noise ratio (SNR) of channels CH1, CH2, CH3, and CH4. For example, when the controller 220 detects that the channel CH2 has the smallest signal to noise ratio among channels CH1, CH2, CH3, and CH4 (meaning that the quality of the channel CH2's received signal is the relatively worst one), the controller 220 can first perform the gain adjustment operation on the receiving path 210B, so as to improve the quality of channel CH2's received signal correspondingly.

Since the data receiver 100 and 200 can, in the data mode, adjust the analog gain level of the programmable gain amplifier in response to the change in the channel transmission condition and can compensate for the change in the analog gain level by adjusting the digital gain level of the digital automatic gain control circuit, the signal quality can be maintained by dynamically adjusting the gain, thereby reducing the gain error.

Figure 3:
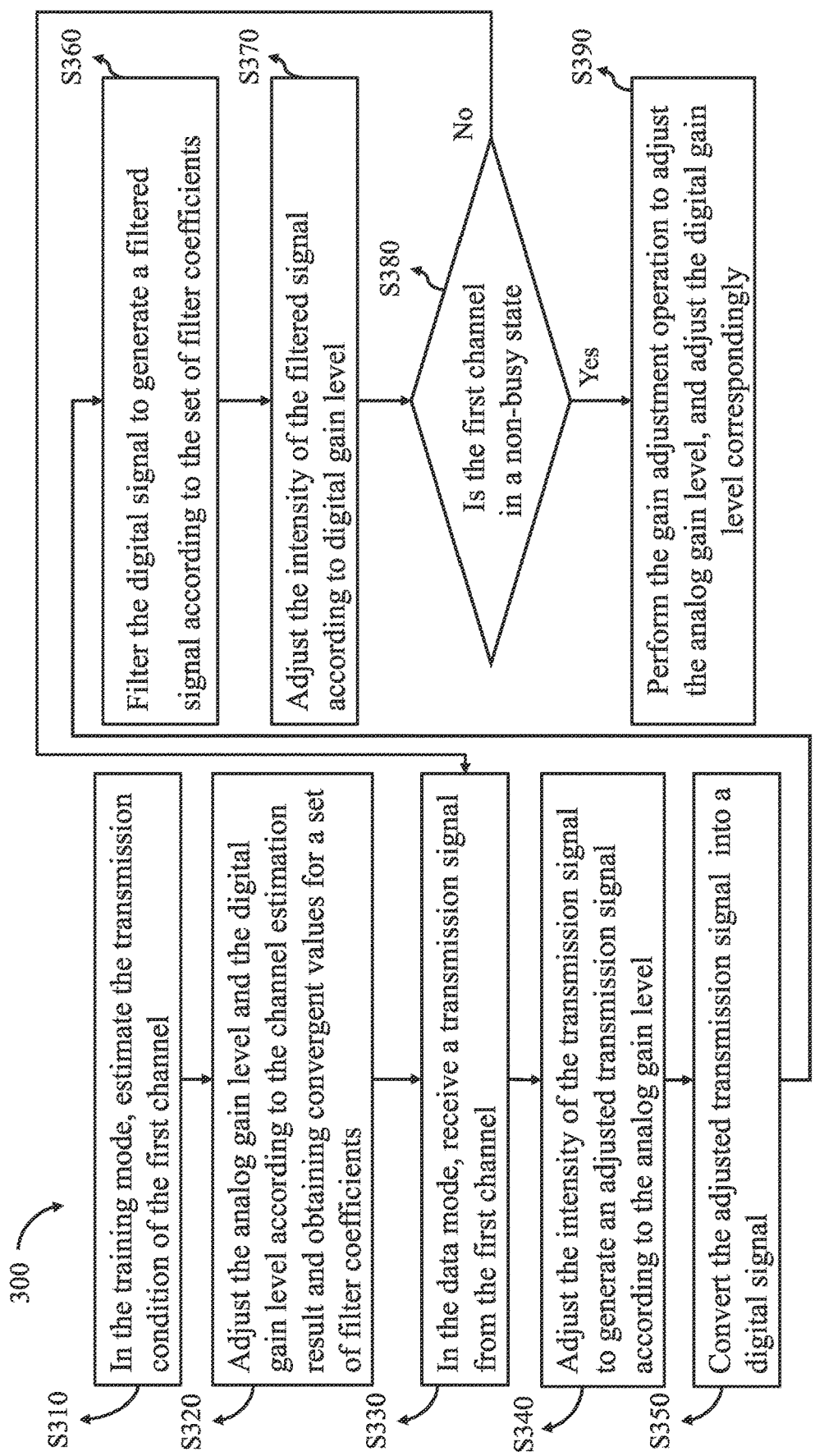
FIG. 3 is a flow chart illustrating a method for receiving data according to one embodiment of the present disclosure.

FIG. 3 is a flow chart illustrating a method for receiving data 300 according to one embodiment of the present disclosure. In some embodiments, the method for receiving data 300 can be used, for example, but not limited, the data receiver 100 (referring to FIG. 1) can include steps S310 to S390.

S310: in the training mode, estimating the transmission condition of the channel CH1.

S320: adjusting the analog gain level and the digital gain level according to the estimation result of the transmission condition of the channel CH1 and obtaining convergent values for a set of filter coefficients before the training mode ends.

S330: in the data mode, receiving a transmission signal $SIG_{T1}$ from the channel CH1.

S340: adjusting the intensity of the transmission signal $SIG_{T1}$ to generate an adjusted transmission signal $SIG_{A1}$ according to the analog gain level.

S350: converting the adjusted transmission signal $SIG_{A1}$ into a digital signal $SIG_{D1}$.

S360: filtering the digital signal $SIG_{D1}$ to generate a filtered signal $SIG_{F1}$ according to the set of filter coefficients.

S370: adjusting the intensity of the filtered signal $SIG_{F1}$ according to digital gain level.

S380: determining whether the channel CH1 is in a non-busy state; if yes, then the method proceeds to step S390; if not, then the method proceeds to step S330.

S390: performing the gain adjustment operation to adjust the analog gain level, and adjusting the digital gain level correspondingly according to the adjustment to the analog gain level in the data mode.

In the training mode, step S310 and step S320 can estimate the transmission condition of the channel CH1 and can adjust the analog gain level and the digital gain level accordingly so as to generate convergent values for a set of filter coefficients so that the data receiver 100 can receive data in a better status.

After the training mode ends, the method 300 can enter the data mode. In the data mode, the method 300 can perform step S330-S370 to receive and process the transmission signal $SIG_{T1}$ according to the settings previously made in the training mode. Besides, in the data mode, the method 300 can further determine whether the channel CH1 is in a non-busy state in step S380, and can perform the gain adjustment operation in Step S390 when the channel CH1 is in the non-busy state. In other words, in the data mode, the method 300 can adjust the analog gain level and adjust the digital gain level correspondingly according to the adjustment to the analog gain level. In this way, in the data mode, when the channel transmission condition changes, the analog gain level can be adjusted dynamically so as to maintain signal quality; also, the digital gain level is adjusted to compensate for the change in the analog gain level, thereby reducing the gain error. In some embodiments, the method 300 can omit step S380 to perform the gain adjustment operation directly when the transmission condition of the channel CH1 changes.

In some embodiments, to adjust the analog gain level more accurately, in the training mode, the method 300 can further switch the analog gain level among a plurality of values to adjust the intensity of the transmission signal $SIG_{T1}$ to a different extent and generate a corresponding adjusted transmission signal $SIG_{A1}$, and can record the average signal intensity of the digital signal $SIG_{D1}$ when the analog gain level is switched to different values. In this way, it is feasible to determine the effect that the analog gain level of different values may exert on the intensity of the digital signal $SIG_{D1}$ more accurately. Therefore, in step S320, the analog gain level can be adjusted further according to the average signal intensity of the digital signal $SIG_{D1}$ when the analog gain level is switched to different values, in addition to the estimation result of the channel transmission condition.

Figure 4:
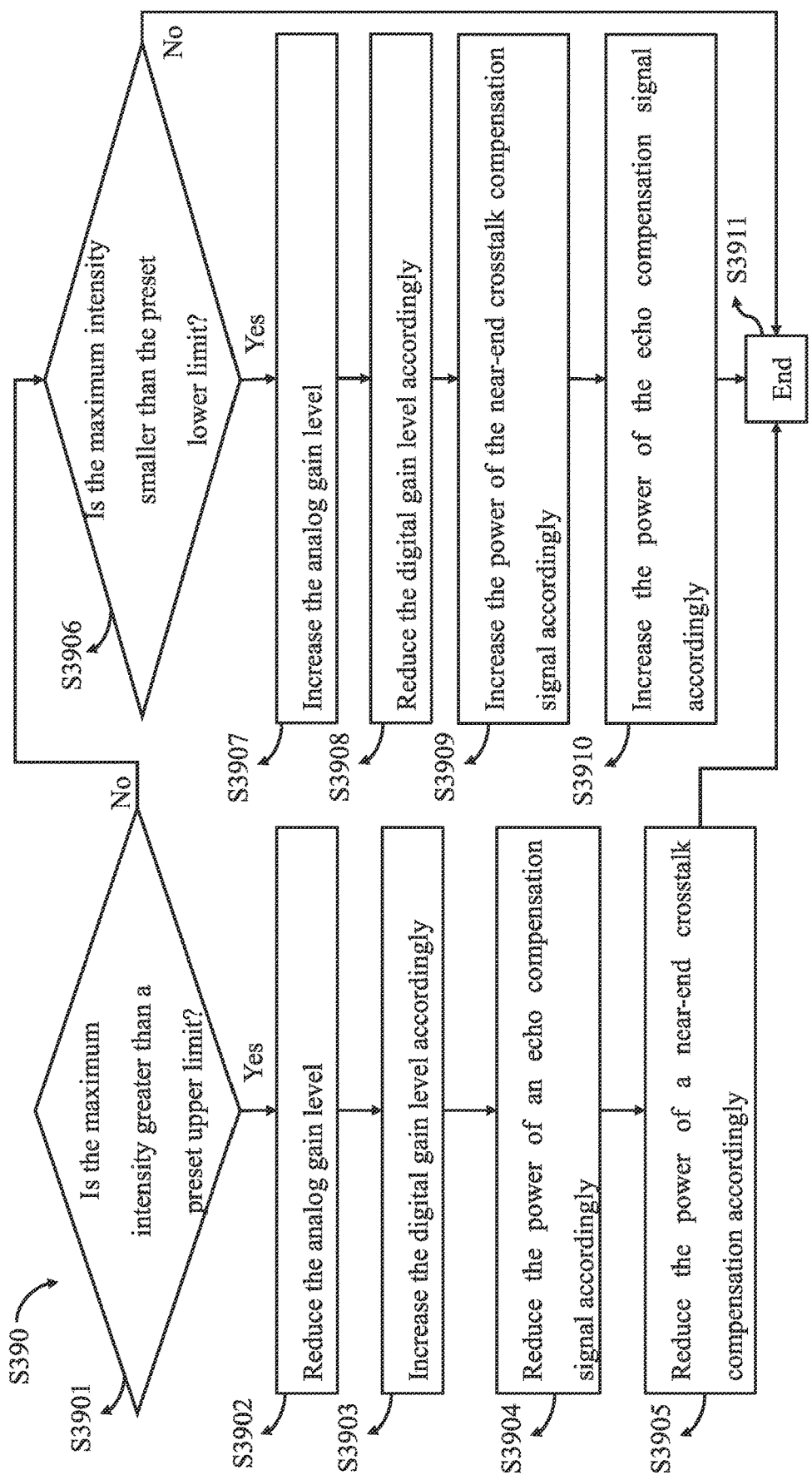
FIG. 4 is a flow chart illustrating sub-steps of the gain adjustment operation in FIG. 3.

FIG. 4 is a flow chart illustrating sub-steps of step S390 (the gain adjustment operation) in FIG. 3. Step S390 can include sub-steps S3901 to S3911.

S3901: determining whether the maximum intensity of the digital signal $SIG_{D1}$ is greater than a preset upper limit UL; when the maximum intensity of the digital signal $SIG_{D1}$ is greater than the preset upper limit UL, the method proceeds to step S3902; otherwise, the method proceeds to step S3906.

S3902: reducing the analog gain level.

S3903: increasing the digital gain level according to a first signal intensity difference between the digital signal $SIG_{D1}$ before and after the analog gain level reduction.

S3904: reducing the power of an echo compensation signal $SIG_{EC}$ according to the first signal intensity difference.

S3905: reducing the power of a near-end crosstalk compensation signal $SIG_{XTC}$ according to the first signal intensity difference; then, the method proceeds to step S3911.

S3906: determining whether the maximum intensity of the digital signal $SIG_{D1}$ is less than a preset lower limit LL; when the maximum intensity of the digital signal $SIG_{D1}$ is less than the preset lower limit LL, the method proceeds to step S3907; otherwise, the method proceeds to step S3911.

S3907: increasing the analog gain level.

S3908: reducing the digital gain level according to a second signal intensity difference between the digital signal $SIG_{D1}$ before and after the analog gain level increase.

S3909: increasing the power of the near-end crosstalk compensation signal $SIG_{XTC}$ according to the second signal intensity difference.

S3910: increasing the power of the echo compensation signal $SIG_{EC}$ and increasing the power of the near-end crosstalk compensation signal $SIG_{XTC}$ according to the second signal intensity difference; then, the method proceeds to Step S3911.

S3911: End.

In some embodiments, preset upper limit UL can be the sum of the maximum expected value AO and tolerance value AR of the digital signal $SIG_{D1}$, whereas the preset lower limit LL can be the difference between the maximum expected value AO and the tolerance value AR of the digital signal $SIG_{D1}$, see, as Equation (1) and Equation (2) above. In this way, in the data mode, the method 300 can reduce the analog gain level when the digital signal $SIG_{D1}$ intensity is excessive high and increase the analog gain level when the digital signal $SIG_{D1}$ intensity is excessive low by performing the gain adjustment operation so that the digital signal $SIG_{D1}$ is maintained at a suitable intensity. Besides, in response to the adjustments to the analog gain level, the method 300 can further adjust the digital gain level to reduce the gain error and can adjust the power of the echo compensation signal $SIG_{EC}$ and the power of the near-end crosstalk compensation signal $SIG_{XTC}$, so as to maintain the environment stability of the signal reception.

Moreover, in some embodiments, the method for receiving data 300 can perform several consecutive gain adjustment operations so as to adjust the analog gain level to a stable value, and after the completion of each gain adjustment operation, it is feasible to wait for a specific time gap, so that the next gain adjustment operation is performed after the circuit components on the receiving path are stabilized, so as to maintain the stability of the system.

Besides, in some embodiments, the method for receiving data 300 can be applied in data receiving systems with multiple channels, such as (but not limited to) the data receiver 200 shown in FIG. 2. In this case, in response to channels CH1, CH2, CH3, and CH4, the method for receiving data 300 can perform the gain adjustment operation on the receiving paths 210A, 210B, 210C, and 210D, respectively. In some embodiments, the method for receiving data 300 can perform the gain adjustment operation on receiving paths 210A, 210B, 210C, and 210D in a pre-determined order; however, in some other embodiments, the method for receiving data 300 can determine the sequence in which the gain adjustment operation is performed according to the signal to noise ratio (SNR) of channels CH1, CH2, CH3, and CH4. For example, when the channel CH2 has the relatively smallest signal to noise ratio among channels CH1, CH2, CH3, and CH4 (meaning that the quality of the channel CH2's received signal is the relatively worst one), the method for receiving data 300 can first perform the gain adjustment operation on the receiving path 210B, so as to improve the quality of channel CH2's received signal correspondingly.

In view of the foregoing, the method for receiving data and data receiver according to embodiments of the present disclosure can adjust the analog gain level in the data mode to respond to the change in the channel transmission condition, and adjust the digital gain level to compensate for the change in the analog gain level according to the adjustment to the analog gain level, so that the signal quality can be dynamically maintained and the gain error can be reduced.

What is claimed is:

1. A method for receiving data, comprising:
   receiving a first transmission signal from a first channel;
   adjusting an intensity of the first transmission signal to generate an adjusted transmission signal according to an analog gain level;
   converting the adjusted transmission signal into a digital signal;
   filtering the digital signal to generate a filtered signal according to a set of filter coefficients; and
   adjusting an intensity of the filtered signal according to a digital gain level;
   wherein the method for receiving data further comprises, in a training mode:
      estimating a transmission condition of the first channel to generate an estimation result; and
      adjusting the analog gain level and the digital gain level according to the estimation result, so as to obtain convergent values for the set of filter coefficients before the training mode ends; and
   in a data mode:
      performing a first gain adjustment operation to adjust the analog gain level and to correspondingly adjust the digital gain level according to the adjustment made to the analog gain level in the data mode.

2. The method for receiving data of claim 1, further comprising:
   in the training mode, switching the analog gain level among a plurality of values to adjust the intensity of the first transmission signal and generate a corresponding adjusted transmission signal; and
   recording an average value of a plurality of signal intensities of the digital signal that is converted from the corresponding adjusted transmission signal corresponding to the plurality of values of the analog gain level;
   wherein in the training mode, the step of adjusting the analog gain level according to the estimation result comprises: adjusting the analog gain level according to the estimation result and the average value of the plurality of signal intensities.

3. The method for receiving data of claim 2, wherein the first gain adjustment operation comprises:
   reducing the analog gain level and increasing the digital gain level according to a first signal intensity difference between the digital signal before and after the reduction of the analog gain level; or
   increasing the analog gain level and reducing the digital gain level according to a second signal intensity difference between the digital signal before and after the increase of the analog gain level.

4. The method for receiving data of claim 3, further comprising:
   generating an echo compensation signal to reduce an echo noise in the digital signal; and
   the first gain adjustment operation further including:
   reducing a power of the echo compensation signal according to the first signal intensity difference; or
   increasing the power of the echo compensation signal according to the second signal intensity difference.

5. The method for receiving data of claim 3, further comprising:
   generating a near-end crosstalk compensation signal to reduce a near-end crosstalk noise in the digital signal; and
   the first gain adjustment operation further including:
   reducing a power of the near-end crosstalk compensation signal according to the first signal intensity difference; or
   increasing the power of the near-end crosstalk compensation signal according to the second signal intensity difference.

6. The method for receiving data of claim 1, wherein the step of performing the first gain adjustment operation to adjust the analog gain level comprises:
   reducing the analog gain level when it is determined that a maximum intensity of the digital signal is greater than a preset upper limit; or
   increasing the analog gain level when it is determined that the maximum intensity of the digital signal is less than a preset lower limit.

7. The method for receiving data of claim 6, wherein:
   the preset upper limit is the sum of a maximum expected value and a tolerance value of the digital signal;
   the preset lower limit is the difference between the maximum expected value and the tolerance value of the digital signal; and the tolerance is greater than a difference between the average value of the signal intensities outputted by the digital signal when the analog gain level is switched between any two adjacent levels.

8. The method for receiving data of claim 1, further comprising:
in the data mode, performing the first gain adjustment operation on the first channel for multiple times, wherein there is a time gap between two adjacent first gain adjustment operations.

9. The method for receiving data of claim 1, further comprising:
receiving a second transmission signal from a second channel; and
in the data mode, performing a second gain adjustment operation corresponding to the second channel;
wherein:
the first gain adjustment operation and the second gain adjustment operation are performed in a predetermined order; or
the first gain adjustment operation is performed first if the first channel has a lowest signal-to-noise ratio, and the second gain adjustment operation is performed first if the second channel has the lowest signal-to-noise ratio.

10. The method for receiving data of claim 1, further comprising:
determining that whether the first channel is in a non-busy state, wherein the first gain adjustment operation is performed when the first channel is in the non-busy state.

11. A data receiver, comprising:
a first receiving path, configured to receive a first transmission signal from a first channel, wherein the first receiving path comprises:
a programmable gain amplifier, configured to adjust an intensity of the first transmission signal to generate an adjusted transmission signal according to an analog gain level;
an analog to digital converter, configured to convert the adjusted transmission signal into a digital signal;
an equalizer, configured to filter the digital signal to generate a filtered signal according to a set of filter coefficients; and
a digital automatic gain control circuit, configured to adjust an intensity of the filtered signal according to a digital gain level; and
a controller, coupled to the first receiving path and configured to:
in a training mode, estimate a transmission condition of the first channel to generate an estimation result, and adjust the analog gain level and the digital gain level according to the estimation result, so as to obtain convergent values for the set of filter coefficients before the training mode ends; and
in a data mode:
perform a first gain adjustment operation to adjust the analog gain level and to correspondingly adjust the digital gain level according to the adjustment made to the analog gain level in the data mode.

12. The data receiver of claim 11, wherein:
the controller is further configured to, in the training mode, switch the analog gain level among a plurality of values to adjust the intensity of the first transmission signal and generate a corresponding adjusted transmission signal, and record an average value of a plurality of signal intensities of the digital signal that is converted from the corresponding adjusted transmission signal corresponding to the plurality of values of the analog gain level; and
in the training mode, the controller adjusts the analog gain level according to the estimation result and the average value of the plurality of signal intensities.

13. The data receiver of claim 12, wherein the controller is configured to, during the first gain adjustment operation:
reduce the analog gain level, and increase the digital gain level according to a first signal intensity difference between the digital signal before and after the reduction of the analog gain level; or
increase the analog gain level, and reduce the digital gain level according to a second signal intensity difference between the digital signal before and after the increase of the analog gain level.

14. The data receiver of claim 13, wherein the first receiving path further comprises an echo canceller, configured to generate an echo compensation signal to reduce an echo noise in the digital signal, wherein the controller is further configured to, during the first gain adjustment operation:
reduce a power of the echo compensation signal according to the first signal intensity difference, or increase the power of the echo compensation signal according to the second signal intensity difference.

15. The data receiver of claim 13, wherein the first receiving path further comprises a near-end crosstalk canceller, configured to generate a crosstalk compensation signal to reduce a near-end crosstalk noise in the digital signal, wherein the controller is further configured to, during the first gain adjustment operation:
reduce a power of the near-end crosstalk compensation signal according to the first signal intensity difference; or
increase the power of the near-end crosstalk compensation signal according to the second signal intensity difference.

16. The data receiver of claim 11, wherein during the first gain adjustment operation:
the controller reduces the analog gain level when it determines that a maximum intensity of the digital signal is greater than a preset upper limit; or
the controller increases the analog gain level when it determines that the maximum intensity of the digital signal is less than a preset lower limit.

17. The data receiver of claim 16, wherein:
the preset upper limit is the sum of a maximum expected value and a tolerance value of the digital signal;
the preset lower limit is the difference between the maximum expected value and the tolerance value of the digital signal; and
the tolerance is greater than a difference between the average value of the signal intensities outputted by the digital signal when the analog gain level is switched between any two adjacent levels.

18. The data receiver of claim 11, wherein:
the controller is further configured to, in the data mode, perform the first gain adjustment operation for multiple times, wherein there is a time gap between two adjacent first gain adjustment operations.

19. The data receiver of claim 11, further comprising a second receiving path, coupled to the controller and configured to receive a second transmission signal from a second channel, wherein:

the controller is further configured to, in the data mode, perform a second gain adjustment operation corresponding to the second channel; and the controller performs the first gain adjustment operation and the second gain adjustment operation in a predetermined order; or the controller performs the first gain adjustment operation first if the first channel has a lowest signal-to-noise ratio, and performs the second gain adjustment operation first if the second channel has the lowest signal-to-noise ratio.

20. The data receiver of claim 11, wherein the controller is further configured to determine that whether the first channel is in a non-busy state, and the controller performs the first gain adjustment operation when the first channel is in the non-busy state.

* * * * *